United States Patent [19]

Beale

[11] Patent Number: 4,655,893

[45] Date of Patent: * Apr. 7, 1987

[54] CUBIC BORON NITRIDE PREPARATION UTILIZING A BORON AND NITROGEN BEARING GAS

[75] Inventor: Harry A. Beale, Columbus, Ohio

[73] Assignee: Battelle Development Corporation, Columbus, Ohio

[*] Notice: The portion of the term of this patent subsequent to Nov. 1, 2000 has been disclaimed.

[21] Appl. No.: 531,119

[22] Filed: Sep. 12, 1983

Related U.S. Application Data

[63] Continuation-in-part of Ser. No. 464,302, Feb. 7, 1983, abandoned.

[51] Int. Cl.$^4$ .............................................. C23C 14/34
[52] U.S. Cl. ............................... 204/192.15; 204/164; 204/192.1; 204/192.31; 427/38
[58] Field of Search ............... 204/164, 192 R, 192 N, 204/192 C, 192 SP; 427/37, 39, 42

[56] References Cited

U.S. PATENT DOCUMENTS

| | | | |
|---|---|---|---|
| 3,499,799 | 3/1970 | Patterson | 427/255.2 X |
| 3,656,995 | 4/1972 | Reedy, Jr. | 427/255.2 |
| 3,692,566 | 9/1972 | Branovich et al. | 427/255.2 |
| 3,912,461 | 10/1975 | Wakefield | 204/192 C X |
| 4,297,387 | 10/1981 | Beale | 204/192 C X |
| 4,337,300 | 6/1982 | Itaba et al. | 427/255.2 X |
| 4,412,899 | 11/1983 | Beale | 204/192 N X |
| 4,415,420 | 11/1983 | Beale | 204/192 N X |
| 4,440,108 | 4/1984 | Little et al. | 204/298 X |

FOREIGN PATENT DOCUMENTS

| | | | |
|---|---|---|---|
| 0042480 | 4/1977 | Japan | 204/192 N |

Primary Examiner—John F. Niebling
Assistant Examiner—Nam X. Nguye
Attorney, Agent, or Firm—Benjamin Mieliulis; John L. Gray

[57] ABSTRACT

Cubic boron nitride is deposited on a substrate by an activated reactive evaporation method involving heating a substrate in a vacuum, evaporating metal vapors into a zone between the substrate and the metals source, said source consisting of one or more materials selected from the group consisting of the elements chromium, nickel, cobalt, aluminum, and manganese; introducing a boron and nitrogen containing gas into the zone, such as borazene ($B_3N_3H_6$), a mixture of diborane and nitrogen, or a mixture of boron trichloride and ammonia, for example, and generating an electrical field in the zone in order to ionize the metal vapors and gas atoms in the zone with an electrically negative bias impressed on the substrate, the value of the bias depending upon the particular activated reactive evaporation process utilized, whereby cubic boron is produced containing from 0.05 percent to 5.0 percent of one or more of the aforesaid elements. Pure nitrogen gas may also be co-admitted as a carrier gas so as to enable operation at higher gas flows.

11 Claims, No Drawings

CUBIC BORON NITRIDE PREPARATION UTILIZING A BORON AND NITROGEN BEARING GAS

This application is a continuation-in-part of U.S. Pat. application Ser. No. 464,302, filed Feb. 7, 1983 now abandoned.

BACKGROUND OF THE INVENTION

Present day commercially available boron nitride having a cubic structure at room temperature generally has been prepared by using high pressure technology and processing techniques. Cubic boron nitride (CBN) produced by this process is expensive because of the complexity and attendant low volume associated with such high pressure processing.

Cutting tools coated with CBN are particularly attractive because higher cutting rates, compared to tungsten carbide, are possible. Also because a coolant can be used with CBN cutting tools, better surface finishes usually can be obtained than when using the $Al_2O_3$-TiC-TiN-$TiO_2$ type cutting tools dry.

U.S. Pat. No. 3,918,219, Wentorf, Jr., et al., discloses the conversion of CBN from hexagonal boron nitride (HBN) using certain aluminum alloys as catalysts. This process is carried on at a high pressure and high temperature. CBN can be formed from BN at temperatures near 1800° C. and at pressures of approximately 85 kilobars with various materials such as alkali and alkaline earth metals, and aluminide forming materials as catalysts.

U.S. Pat. No. 3,791,852, Bunshah, describes a process and apparatus for the production of carbide films by physical vapor deposition by means of an activated reactive evaporation deposition technique. This patent, including its drawing figure of a typical apparatus and description thereof, is incorporated in this disclosure by reference.

U.S. Pat. No. 4,297,387, Beale, discloses a process of making CBN utilizing an activated reactive evaporation technique which involves evaporating an alloy of boron and aluminum and at least one of cobalt, nickel, manganese, or other aluminide-forming elements in the presence of ammonia gas while generating an electrical field in the zone for ionizing the metal vapors and gas atoms in the zone. The temperature is maintained at least at 300° C. with a preferred temperature of between 500° C. and 1100° C. with the ammonia gas pressure preferably between $1 \times 10^{-4}$ torr to $8 \times 10^{-3}$ torr.

U.S. Pat. No. 4,297,387, Beale, relies on the vaporization of a cubic phase nucleator which also functions as a barrier to possible dislocation motion or transformation nuclei formation in the form of an aluminide made from cobalt, nickel, manganese, zirconium, or iron.

This patent also utilizes ammonia ($NH_3$) gas which is hygroscopic. Because it is hygroscopic, it presents difficulties with respect to the introduction of impurities.

In applicant's copending U.S. Pat. application Ser. No. 464,304, filed Feb. 7, 1983, there is disclosed a process involving the formation of CBN at relatively low temperatures utilizing the activated reactive evaporation deposition process without the need to include aluminum as an alloying element in the metal alloy source so as to form an aluminide. However, that patent application utilizes ammonia gas as a source of nitrogen.

In applicant's other copending U.S. Pat. application Ser. No. 464,300, filed Feb. 7, 1983, there is disclosed another process involving the formation of CBN at relatively low temperatures utilizing the activated reactive evaporation deposition process where the gas used is nitrogen.

SUMMARY OF THE INVENTION

The present invention involves the formation of CBN at relative low temperatures utilizing the activated reactive evaporation deposition process wherein a boron and nitrogen containing gas is used rather than ammonia gas or nitrogen gas as a source of nitrogen. This gas also provides a source of boron thus permitting the operation of the process at a preferred temperature that is significantly below that which would otherwise be the case and in fact below 500° C. In order to improve the quality of the CBN formed, small amounts (from 0.05 percent to 5.0 percent) of chromium, nickel, cobalt, or manganese are preferably introduced into the CBN by vaporization in the presence of an electrical field. Therefore, the metals source may be one or more materials selected from the group consisting of chromium, nickel, cobalt, aluminum, and manganese. The boron and nitrogen containing gas may be borazene ($B_3N_3H_6$) or a mixture of diborane and nitrogen, a mixture of boron trichloride and ammonia, or any other boron and nitrogen bearing gases. Nitrogen gas may be used as a carrier gas to increase the gas flow rate. In order to form cubic boron nitride using this process, it is necessary to have a plasma present during the deposition process and an electrically negative bias must be impressed on the substrate. The value of the required bias voltage is a function of the particular coating deposition process utilized.

DETAILED DESCRIPTION OF THE INVENTION

The invention involves the deposition of CBN on a substrate through activated reactive evaporation including the steps of (a) heating the substrate in a vacuum, (b) evaporating metal vapors into a zone between the substrate and the metals source, (c) introducing a boron and nitrogen containing gas into the zone, and (d) generating an electrical field in the zone in order to ionize the metal vapors and gas atoms in the zone in the presence of a plasma with an electrically negative bias impressed on the substrate, thus producing a deposit of CBN on the surface of the substrate.

The metal source may consist of at least one of the elements chromium, nickel, cobalt, aluminum, and manganese. It is important that a plasma be present during the deposition process and that an electrically negative bias be impressed on the substrate. The value of the required electrically negative bias voltage is a function of the particular metallic vapor generating process used in accordance with the following:

| Process | Bias Voltage |
| --- | --- |
| Reactive Evaporation (Electron Beam) | −500 to −3000 volts |
| Reactive Sputtering (DC) | −200 to −3000 volts |
| Reactive Sputtering (RF) | −100 to −3000 volts |
| Reactive Sputtering (Magnetron) | −500 to −3000 volts |
| Arc Discharge | −20 to −2000 volts |

The use of such bias voltage allows the deposition temperature to be reduced below 500° C.

To practice the invention's method, one utilizes a vacuum chamber apparatus, such as illustrated in the aforementioned U.S. Pat. No. 3,791,852, Bunshah. Such an apparatus includes a vacuum chamber which may comprise a conventional cover or dome resting on a base with a sealing gasket at the lower rim of the cover. A support and feed unit for a source metal rod may be mounted in the base. The unit includes a mechanism for moving the metal rod upward at a controlled rate. Cooling coils may be mounted in the unit and supplied with cooling water from a cooling water source. An electron gun is mounted in the unit and provides an electron beam along the path to the upper surface of the metal rod, with the electron gun being energized from a power supply.

A substrate on which the CBN is to be deposited is supported in a frame on a rod projecting upward from the base. The substrate is heated by an electric resistance heater supported on a bracket. Energy for the heater is provided from a power supply via a cable. The temperature of the substrate is maintained at a desired value by means of a thermocouple in contact with the upper surface of the substrate, with the thermocouple connected to a controller by a line, with the controller output signal regulating the power from the supply to the heater.

The desired low pressure is maintained within the vacuum chamber by a vacuum pump connected to the interior of the chamber via a line. Nitrogen and boron containing gas from a supply is introduced into the zone between the metal rod and substrate via a line and nozzle. It is essential that the tubulation which carries the nitrogen and boron containing gas and the nitrogen carrier gas be water-cooled up to the location where the substrates for coating are positioned. This is necessary because the gas in question decomposes at a temperature in excess of 30° C. and the substrate temperature will be in excess of 150° C. Therefore, in order to prevent premature decomposition of the gas it is necessary to keep it cooled prior to its exposure to the substrate. A shutter is mounted on a rod which is manually rotatable to move the shutter into and out of position between the metal rod and substrate.

A deflection electrode, typically a tungsten rod, is supported from the base in the reaction zone between the metal rod and substrate. An electric potential is provided for the rod from a voltage supply via a line. An electric insulating sleeve, typically of glass, is provided for the rod within the vacuum chamber, with the metal surface of the rod exposed only in the zone between the source and substrate. When a potential is connected to this electrode, some of the electrons from a region just above and/or adjacent to the molten pool, liberated at the end of the rod, are attracted to the reaction zone. The pool is the preferred source of electrons for the electrode, but a separate electron emitter could be added if desired.

Various components utilized in the apparatus described above may be conventional. The evaporation chamber may be a 24 inch diameter and 36 inch high water cooled stainless steel bell jar. The vacuum pump may be a 10 inch diameter fractionating diffusion pump, with an antimigration-type liquid nitrogen trap. The source metal unit may be a one inch diameter rod fed electron beam gun, self-accelerated 270° deflection type, such as Airco Temescal Model RIH-270. The power supply may be an Airco Temescal Model CV30, 30kw unit which may be operated at a constant voltage such as 10 kilovolts, with a variable emission current.

Various sizes and shapes of substrates can be utilized. A typical substrate is a three inch by ten inch metal sheet in the order of five mils thick. Various metals have been used including stainless steel, titanium, and zirconium. Other substrate materials can be used including tool steels and carbides, such as WC/C alloy and SiC. In one embodiment the substrate is based about eight inches above the surface of the metal source. The heater may be a 18 kilowatt tantalum resistance heater providing for heating the substrate to 700° C. and higher temperatures, as desired.

The metals source material may be a solid rod or billet and for the just-described feed unit may approximate about one inch in diameter and six inches in length. The solid rod for the metals source may be provided by a preparation method in which particulate metals mixed together in the amount providing the desired requisite composition are melted and molten drops therefrom dripped or flowed into a water-cooled cylindrical mold of appropriate material and size.

At least one of the elements chromium, nickel, cobalt, aluminum and manganese, may be used as the metals source. The amount of metal evaporated and the rate of gas flow is correlated so that the CBN produced contains from 0.05 weight percent to 5.0 weight percent of one of the metal elements. The smaller quantities of additives are acceptable because a molecule of boron nitride results directly from the decomposition of the gas instead of having to be formed during the process from the elements.

The present invention employs a nitrogen and boron containing gas as the source of nitrogen and boron in formation of the CBN placed on the substrate. This gas is admitted or introduced generally through needle valves at a rate adequately correlated with the rate at which the metal vapors are provided so that adequate amounts of CBN can be formed from the decomposition of the gas. Of course, the partial pressure of the introduced gas needs be such that ionization can be provided, such as by the usual electrical field. A preferred range for gas pressure is about $1 \times 10^{-4}$ torr to $8 \times 10^{-3}$ torr.

Plasma activation is essential to effect the completion of the chemical reaction to produce CBN.

It is also essential that an electrically negative bias be impressed on the substrate. The value of the required bias voltage is a function of the particular coating deposition process employed as has been set forth above and this permits the reduction of the required deposition temperature to below 500° C.

Although the invention has been described as applied to sheet substrates, other configurations are within the scope of the invention such as tool shapes which may have CBN deposited thereon. For example: reamers, gear cutters, and the like, may have CBN deposited thereon since there are very few restrictions on substrate geometry that exist in evaporating and coating.

Additionally, it is within the realm of the invention to contemplate producing a coating deposit-substrate interdiffusion, e.g., by heat treatment, to improve deposit adherence. Further, deposition of various alloying elements along with the CBN is contemplated for various purposes, such as improving deposit ductility. It has been noted that slight amounts of nickel deposited along with the CBN increases deposit ductibility.

While this invention has been described in its preferred embodiment, it is to be appreciated variations therefrom may be made without departing from the true scope and spirit of the invention.

What is claimed is:

1. A method for depositing cubic boron nitride on a substrate, comprising the steps of:
   (a) heating a supported substrate in a vacuum;
   (b) supplying metal vapors from a metals source by a process of reactive evaporation or reactive sputtering or arc discharge into a zone between said substrate and the metals source, said source consisting of one or more metals selected from the group consisting of the elements chromium, nickel, cobalt, aluminum and manganese;
   (c) introducing nitrogen and boron containing gas selected from the group consisting of borazene, a mixture of diborane and nitrogen, and a mixture of boron trichloride and ammonia into said zone;
   (d) generating an electrical field in said zone for ionizing the metal vapors and gas atoms in the zone; and
   (e) maintaining an electrically negative bias impressed on said substrate depending upon the process employed in step (b) and in accordance with the following schedule:

| Process | Bias Voltage |
| --- | --- |
| Reactive Evaporation (Electron Beam) | −500 to −1000 volts |
| Reactive Sputtering (DC) | −200 to −3000 volts |
| Reactive Sputtering (RF) | −100 to −3000 volts |
| Reactive Sputtering (Magnetron) | −500 to −3000 volts |
| Arc Discharge | −20 to −2000 volts | whereby cubic boron nitride is deposited on the surface of said substrate.

2. The method of claim 1 including directing an electron beam onto the metals source for providing the metal vapors by evaporation.

3. The method of claim 1 wherein the metal vapors are supplied by means of a sputtering cathode.

4. The method of claim 1 wherein the metal vapors are supplied by means of an arc discharge evaporation.

5. The method of claim 4 wherin the arc discharge evaporation involves the use of a hot hollow cathode.

6. The method of claim 1 wherein the substrate is heated to a temperature below 500° C.

7. The method of claim 6 wherein the nitrogen and boron containing gas is introduced in an amount providing a gas partial pressure between about $1 \times 10^{-4}$ torr to $8 \times 10^{-3}$ torr in said zone.

8. The method of claim 1 wherein the nitrogen and boron containing gas is mixed with a nitrogen carrier gas.

9. The method of claim 1 wherein the nitrogen and boron containing gas is borazene.

10. The method of claim 1 wherein the nitrogen and boron containing gas is a mixture of diborane and nitrogen.

11. The method of claim 1 wherein the nitrogen and boron containing gas is a mixture of boron trichloride and ammonia.

* * * * *